(12) United States Patent
Mitsuoka et al.

(10) Patent No.: US 10,207,349 B2
(45) Date of Patent: Feb. 19, 2019

(54) HIGH-PRESSURE CONTAINER, SUBSTRATE PROCESSING APPARATUS, AND METHOD FOR MANUFACTURING HIGH-PRESSURE CONTAINER

(71) Applicant: Tokyo Electron Limited, Tokyo (JP)

(72) Inventors: Kazuyuki Mitsuoka, Yamanashi (JP); Gen You, Kumamoto (JP); Hiroki Ohno, Yamanashi (JP); Takehiko Orii, Yamanashi (JP); Takayuki Toshima, Kumamoto (JP); Hiroaki Inadomi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 796 days.

(21) Appl. No.: 14/086,146

(22) Filed: Nov. 21, 2013

(65) Prior Publication Data

US 2014/0145390 A1    May 29, 2014

(30) Foreign Application Priority Data

Nov. 29, 2012  (JP) .................................. 2012-261110

(51) Int. Cl.
  *B23H 7/02*    (2006.01)
  *B23H 9/00*    (2006.01)
  (Continued)

(52) U.S. Cl.
  CPC .............. *B23H 7/02* (2013.01); *B23H 9/006* (2013.01); *H01L 21/6719* (2013.01);
  (Continued)

(58) Field of Classification Search
  CPC .. B23H 7/02; B23H 9/006; B23H 1/00; H01L 21/67126; H01L 21/67772; H01L 21/6719
  (Continued)

(56) References Cited

U.S. PATENT DOCUMENTS 5,676,860 A * 10/1997 Muro ....................... B23H 7/38
                                                 219/69.16
6,353,199 B1 * 3/2002 Hosaka .................... B23H 1/00
                                                 219/69.11
(Continued)

FOREIGN PATENT DOCUMENTS

JP    04-017333 A    1/1992
JP    2000-340540 A    12/2000
(Continued)

*Primary Examiner* — David Bryant
*Assistant Examiner* — Nirvana Deonauth
(74) *Attorney, Agent, or Firm* — Abelman, Frayne & Schwab (57) ABSTRACT

In the present disclosure, the high-pressure chamber includes a chamber main body including a flat rectangular parallelepiped block of a metal which is formed with a flat cavity that serves as a substrate processing space in which a processing using a high-pressure fluid is performed on a substrate, and the substrate processing space being formed by machining the block from one of faces of the block other than the widest face towards another face opposing thereto. In a case where the cavity is constituted as a through hole, the though hole is provided with a cover configured to open or close the cavity on one side of the through hole, and a second block configured to air-tightly seal the cavity on the other side.

14 Claims, 10 Drawing Sheets

(51) Int. Cl.
   *H01L 21/67*     (2006.01)
   *H01L 21/677*    (2006.01)
   *B23H 1/00*      (2006.01)
(52) U.S. Cl.
   CPC .. *H01L 21/67126* (2013.01); *H01L 21/67772*
                    (2013.01); *B23H 1/00* (2013.01)
(58) Field of Classification Search
   USPC .......................... 28/271, 274, 275; 83/651.1
   See application file for complete search history.

(56)             References Cited

U.S. PATENT DOCUMENTS

| | | | | |
|---|---|---|---|---|
| 8,501,590 | B2* | 8/2013 | Wang | H01L 24/97 |
| | | | | 257/E21.599 |
| 2006/0130747 | A1* | 6/2006 | Ishikawa | G03B 27/32 |
| | | | | 118/52 |
| 2006/0257709 | A1* | 11/2006 | Blum | H01M 8/04022 |
| | | | | 429/423 |
| 2011/0081437 | A1* | 4/2011 | Felker | B29C 45/0025 |
| | | | | 425/129.1 |
| 2012/0266925 | A1* | 10/2012 | Nakashima | H01L 21/6719 |
| | | | | 134/200 |
| 2014/0034238 | A1* | 2/2014 | Wen | H01L 21/6719 |
| | | | | 156/345.1 |
| 2014/0144462 | A1* | 5/2014 | Verhaverbeke | H01L 21/67034 |
| | | | | 134/1.2 |

FOREIGN PATENT DOCUMENTS

| | | |
|---|---|---|
| JP | 2006-130418 A | 5/2006 |
| JP | 2008-515235 A | 5/2008 |
| KR | 10-2012-0119995 A | 11/2012 |

* cited by examiner

HIGH-PRESSURE CONTAINER, SUBSTRATE PROCESSING APPARATUS, AND METHOD FOR MANUFACTURING HIGH-PRESSURE CONTAINER

CROSS-REFERENCE TO RELATED APPLICATIONS

This application is based on and claims priority from Japanese Patent Application No. 2012-261110 filed on Nov. 29, 2012 with the Japan Patent Office, the disclosure of which is incorporated herein in its entirety by reference.

TECHNICAL FIELD

The present disclosure relates to a high-pressure container in which a substrate processing is performed by using a high-pressure fluid.

BACKGROUND

In a semiconductor device manufacturing process in which a laminated structure of an integrated circuit pattern is formed on a surface of a substrate such as, for example, a semiconductor wafer (hereinafter, referred to as a "wafer"), a liquid processing is performed using a rinse liquid such as a chemical liquid to remove fine dusts or a natural oxide film. After the liquid processing, the liquid attached to the wafer is removed. In order to prevent the pattern from collapsing due to the influence of surface tension when the liquid in the pattern is dried, a technique known in the related art removes the liquid using a high-pressure fluid such as a supercritical fluid.

The supercritical fluid has small viscosity, as compared with liquid, as well as high ability to dissolve liquid. In addition, no interface exists between the supercritical liquid and gas in an equilibrium state. Accordingly, when a wafer having liquid attached thereto is placed in a supercritical fluid atmosphere, the liquid in the pattern may be replaced with the supercritical fluid substantially without applying force to the pattern. Then, the supercritical fluid is converted into gas by decreasing the pressure. As a result, the liquid may be removed while suppressing the pattern from being collapsed.

The processing of the wafer using the supercritical fluid is performed in a high-pressure chamber (e.g., a high-pressure container), and carrying-in/out of the wafer is performed through a carrying-in/out port that is configured to be opened/closed, for example, by a cover. In a high-pressure container having a high pressure atmosphere therein, it is desirable that the number of joints is as small as possible. Further, from the viewpoint of reducing the volume of the internal processing space or the force applied to the cover, the high-pressure container should be machined in such a manner that the internal processing space has a relatively small volume and/or the carrying-in/out port has a small opening area. Therefore, the present inventors have studied manufacturing a high-pressure container provided with a processing space configured to accommodate a wafer by cutting the inside of a metal block from a flank side of the block of metal.

Meanwhile, a high-pressure fluid such as a supercritical fluid has high extraction capability, and thus, elutes contaminants attached to the internal wall surface of the high-pressure container when the block is machined. Accordingly, the wafer may be contaminated.

Japanese Patent Laid-Open No. 2006-130418 discloses a technique of forming an oxide film (a passivation film) on a surface to be contacted with a supercritical fluid, for example, by electropolishing in order to suppress metal from being eluted from a high-pressure container (see, e.g., claim 1, lines 1 to 9 of paragraph 0051, lines 2 to 5 of paragraph 0058, and FIG. 4). However, the electropolishing is a finishing processing for planarizing micrometer-level unevenness and thus difficult to remove a layer of contaminants having, for example, a sub-millimeter thickness. Further, when the contaminants attached during the processing do not form an oxide film by the electropolishing, the effect of suppressing the elution to the high-pressure fluid is small.

In addition, in Japanese Patent Laid-Open No. 2008-515235, for a high-pressure processing container in which a processing of removing a resist remained on a surface of a wafer after etching is performed using a supercritical fluid, there is disclosed a technique of coating a plastic or a polymer on an inside member of the high-pressure container which comes in contact with a supercritical fluid (see, e.g., lines 1 to 3 of paragraph 0005, lines 1 to 3 of paragraph 0028, lines 1 to 2 of paragraph 0045, and FIG. 1). However, from the viewpoint of reducing the amount of the supercritical fluid used, it is desirable that the volume of the high-pressure container is as small as possible. Therefore, in some cases, the processing space is constituted as a narrow space the height of which is several millimeters to a dozen or so millimeters. In such a case, for example, if the coating inside the high-pressure container is peeled off, recoating is difficult or takes a time, thereby deteriorating maintainability.

SUMMARY

The present disclosure provides a high-pressure container including: a container body including a flat rectangular parallelepiped block of a metal which is formed with a flat cavity that serves as a substrate processing space in which a processing using a high-pressure fluid is performed on a substrate, the substrate processing space being formed by machining the block from one of faces of the block other than the widest face towards another face opposing thereto; and a cover configured to open/close the wafer processing space, in which at least one of inner wall surfaces of the flat cavity is coated with a plating layer of a noble metal.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in consideration of the above-mentioned problems, and an object thereof is to provide a high-pressure container in which a processing space with high cleanliness may be formed by an easy and simple manner, a substrate processing apparatus having the high-pressure container, and a method of manufacturing the high-pressure container.

In an aspect, the present disclosure provides a high-pressure container including: a container body including a flat rectangular parallelepiped block of a metal which is formed with a flat cavity that serves as a substrate processing space in which a processing using a high-pressure fluid is performed on a substrate, the substrate processing space being formed by machining the block from one of faces of the block other than the widest face towards another face opposing thereto; and a cover configured to open/close the wafer processing space, in which at least one of inner wall surfaces of the flat cavity is coated with a plating layer of a noble metal.

In the above-described high-pressure container, the container body is formed with a through hole on at least one of the faces of the block by the machining, and one end of the through hole is air-tightly sealed by a metal member. The machining is, for example, a wire cut electric discharge machining.

In the above-described high-pressure container, the machining is performed by a die-sinking electric discharge machining in which an electrode formed in a shape corresponding to a shape of the cavity is sequentially brought into close proximity to the block so as to form a cavity which is not penetrated.

In the high-pressure container, the widest face has a short side and a long side that is longer than the short side, and the face on which the cavity is opened is a face at the short side.

The above-described high-pressure container further includes a substrate holding unit configured to restrain a position of the substrate such that the substrate is opposite to the widest face.

In the above-described high-pressure container, a distance between the inner wall surfaces of the cavity is in a range of 5 mm to 15 mm.

In another aspect, the present disclosure provides a high-pressure container including: a container body including a block of metal in which a flat cavity is opened on at least one of faces serving as a processing space for a substrate, in which a plating layer of a noble metal is formed on an inner wall surface of the block, and a cover is provided to open or close the processing space, thereby allowing a processing on the substrate using a high-pressure fluid.

In the above-described high-pressure container, the block has a flat rectangular parallelepiped shape, and the at least one of faces is a face other than a widest face of all faces of the block.

In the above-described high-pressure container, the widest face has a short side and a long side that is longer than the short side, and the face on which the cavity is opened is a face at the short side.

The above-described high-pressure container further includes a substrate holding unit configured to restrain a position of the substrate such that the substrate is opposite to the widest face.

In the above-described high-pressure container, a distance between the inner wall surfaces of the cavity is in a range of 5 mm to 15 mm.

In the above-described high-pressure container, the cavity of the block penetrates from one face to another face opposing thereto, and a metal member is air-tightly bonded to one face among the faces of the block on which a through hole is opened.

Further, the present disclosure provides a substrate processing apparatus including: the above-described high-pressure container; a fluid supply line connected to the high-pressure container and configured to supply a high-pressure fluid or a row material fluid that becomes the high-pressure fluid when performing at least one of heating and pressurization; and a fluid discharge line configured to discharge the high-pressure fluid in the high-pressure container.

Further, the present disclosure provides a method for manufacturing a high-pressure container including: machining from one of faces of a flat rectangular parallelepiped block of metal other than the widest face towards another face opposing thereto, thereby forming a flat cavity serving as a processing space for a substrate; and forming a plating layer of a noble metal on at least one of inner wall surfaces of the block.

In the above-described method, the machining for the cavity includes forming a through hole penetrating from the one face towards another face opposing thereto, and after the machining of the cavity, the method further includes bonding a metal member to one of the faces of the block on which the through hole is opened to air-tightly seal one end of the through hole. In addition, the machining is, for example, a wire cut electric discharge machining.

In the above-described method, the machining is performed by a die-sinking electric discharge machining in which an electrode formed in a shape corresponding to a shape of the cavity is sequentially brought into close proximity with the block to form a non-through cavity.

According to the high-pressure container of the present disclosure, since the interior wall surfaces of the cavity formed by the machining are plated with a noble metal, elution of contaminants may be suppressed in a convenient manner when a substrate processing is performed using a high-pressure fluid in the cavity that serves as a processing space. Thus, substrates may be processed in a clean processing space.

An example of a substrate processing apparatus installed with the high-pressure container according to the present disclosure will be described with reference to FIGS. 1 to 3. The substrate processing apparatus is constituted as a wafer processing apparatus in which a drying processing for a wafer W is performed using a supercritical fluid serving as a high-pressure fluid. The substrate processing apparatus is provided with a processing container 1 that serves as a body of a high-pressure container, and a substantially square rod-shaped cover 3 configured to air-tightly seal a carrying-in/out port 2 of the wafer W formed at a flank of the processing container 1. The cover 3 is provide with a plate-shaped wafer holder 4 on a side facing the processing container 1 in which the wafer holder 4 is a substrate holding unit configured to support the wafer W from the bottom side and carry in/out the wafer W to/from the processing container 1. Further, FIG. 2 illustrates the processing container 1 which is partially cut away and omits the cover 3 and the wafer holder 4.

The processing container 1 includes, for example, a flat rectangular parallelepiped member made of a stainless steel, and a processing space 20 which is a cavity configure to horizontally accommodate and process a wafer W in its inside. Hereinafter, in the carrying-in/out direction of the wafer W with respect to the processing container 1 (the X-direction in FIG. 1), the processing container 1 side and the cover 3 side will be referred to as a rear side and a front side, respectively. The material of the processing container 1 may be a metal other than the stainless steel. For example, metals having corrosion resistance to a high-pressure fluid, for example, nickel alloys (e.g., Hastelloy (registered trademark), Monel (registered trademark), Inconel (registered trademark), and Incoloy (registered trademark)), titanium and titanium alloys may be used as for the material of the processing container 1.

For example, in a case of processing a wafer W having a diameter of 300 mm as a substrate, the processing space 20 is constructed as a flat space having, for example, a height of 5 mm to 15 mm and a volume of 300 $cm^2$ to 1,500 $cm^2$ such that the supercritical fluid supplied to the processing space 20 comes rapidly in contact with the wafer W.

Figure 3:
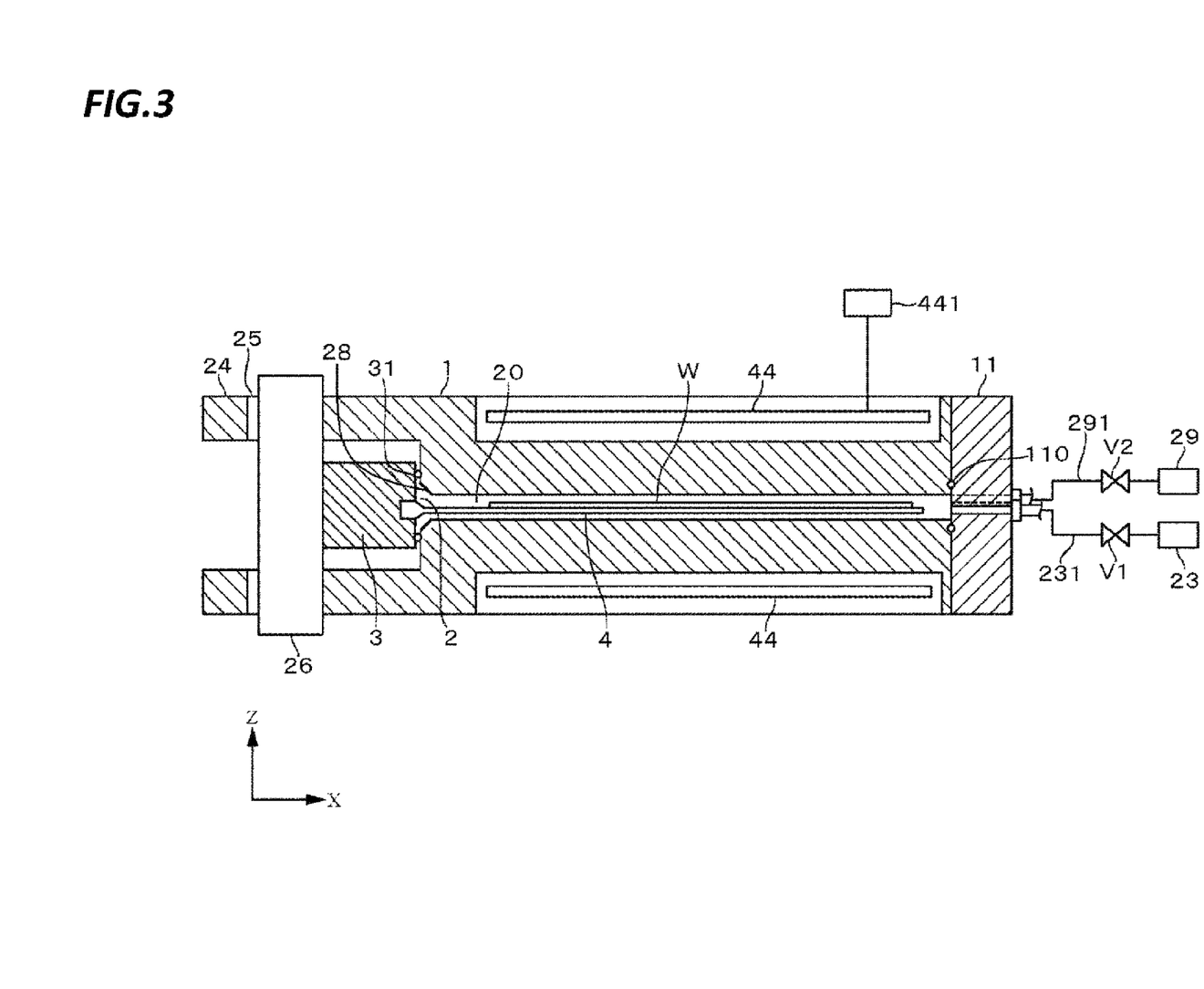
FIG. 3 is a longitudinal sectional side view of the wafer processing apparatus.

As illustrated in FIG. 3, the processing space 20 extends in the front-back direction of the flat processing container 1, and is opened in the front side flank and the rear side flank. Of the openings, the front side opening forms the carrying-in/out port 2 of the wafer W, and is formed to be widened in the width direction of the processing container 1 (a direction orthogonal to the carrying-in/out direction) such that the wafer W is allowed to pass through the wafer holder 4 while being held horizontally. For example, in a case where the processing space 20 is formed by a wire cut discharge processing as described below, the height of the carrying-in/out port 2 is substantially the same as the height of the processing space 20. Accordingly, the height of the carrying-in/out port 2 is also set to, for example, 5 mm to 15 mm. Here, as illustrated in FIG. 3, in order to secure the clearance between the base of the wafer holder 4 held in the cover 3 and the upper and lower internal wall surfaces of the processing container 1, the carrying-in/out port 2 may be provided with a tapered portion 28 formed to be widened vertically from the rear side to the front side.

Meanwhile, the rear end side opening is clogged by a rear cover 11 that is a metal board. The rear cover 11 is connected to a supply line 231 configured to supply a supercritical fluid (for example, supercritical isopropyl alcohol (IPA) or supercritical $CO_2$) into the processing space 20, and a discharge line 291 configured to discharge the supercritical fluid from the processing space 20. As illustrated in FIG. 2, the rear cover 11 is formed with a supply hole 112 configured to supply the supercritical fluid towards the processing space 20, and a discharge hole 111 configured to discharge the supercritical fluid after processing. Further, as illustrated in FIG. 3, an O-ring 110 is provided between the processing container 1 and the rear cover 11 to maintain the inside of the processing container 1 air-tightly, and the rear cover 11 is strongly fastened to the processing container 1 by bolts which are not illustrated.

The supply line 231 is connected to a supply unit 23 configured to supply the supercritical fluid into the processing space 20. The supply unit 23 includes a supply tank configured to heat a raw material of the supercritical fluid and retain the raw material in a supercritical state, and a flow rate regulating unit configured to regulate the supply amount of the supercritical fluid. As illustrated in FIG. 3, an opening/closing valve V1 is interposed on the supply line 231.

Meanwhile, the discharge line 291 is connected to a recovery unit 29 configured to recover the fluid discharged from the processing space 20. The recovery unit 29 is configured as, for example, a recovery mechanism that cools and compresses the supercritical fluid or gas discharged from the processing space 20 to recover the fluid or gas as liquid IPA or liquid $CO_2$, for example, or a recovery tank that retains the recovered liquid as a raw material of the supercritical fluid. As illustrated in FIG. 3, an opening/closing valve V2 is interposed on the discharge line 291.

At the front side flank of the processing container 1, protrusions 24, 24 are provided to extend horizontally towards the front side respectively from the upper and lower positions with a region in contact with the cover 3 being interposed therebetween. The respective protrusions 24, 24 are formed with openings 25, 25. When a lock plate 26 configured to move up and down by a driving unit 27 is inserted vertically into the openings 25, 25, the movement of the cover 3 is restrained from the front side.

At both left and right sides of the upper surface of a lower plate 42, rails 47, 47 are disposed to move the wafer holder 4 back and forth with respect to the processing container 1, and arm members 50, 50 extending horizontally from the left and right ends of the square rod-shaped cover 3 are moved back and forth on the rail 47, 47 via sliders 48, 48 that are moved by driving units 49, 49. When the arm members 50, 50 are moved back and forth, the wafer holder 4 moves between a processing position in the processing container 1 and a transfer position where the wafer W is transferred form/to an external transportation arm. Further, when the wafer holder 4 is moved to the processing position, the carrying-in/out port 2 is air-tightly closed by the cover 3 with an O-ring 31 interposed therebetween. Lock members 45, 45 installed at left and right of the nearer side of an upper plate 41 are rotated by lock cylinders 46, 46 to lock the cover 3 that has blocked the carrying-in/out port 2.

Further, as illustrated in FIGS. 2 and 3, heaters 44 installed on the upper and lower surfaces of the processing container 1 are electrically powered from a power supply unit 441 to heat the inside of the processing space 20 to a temperature higher than the critical temperature of the supercritical fluid.

Figure 1:
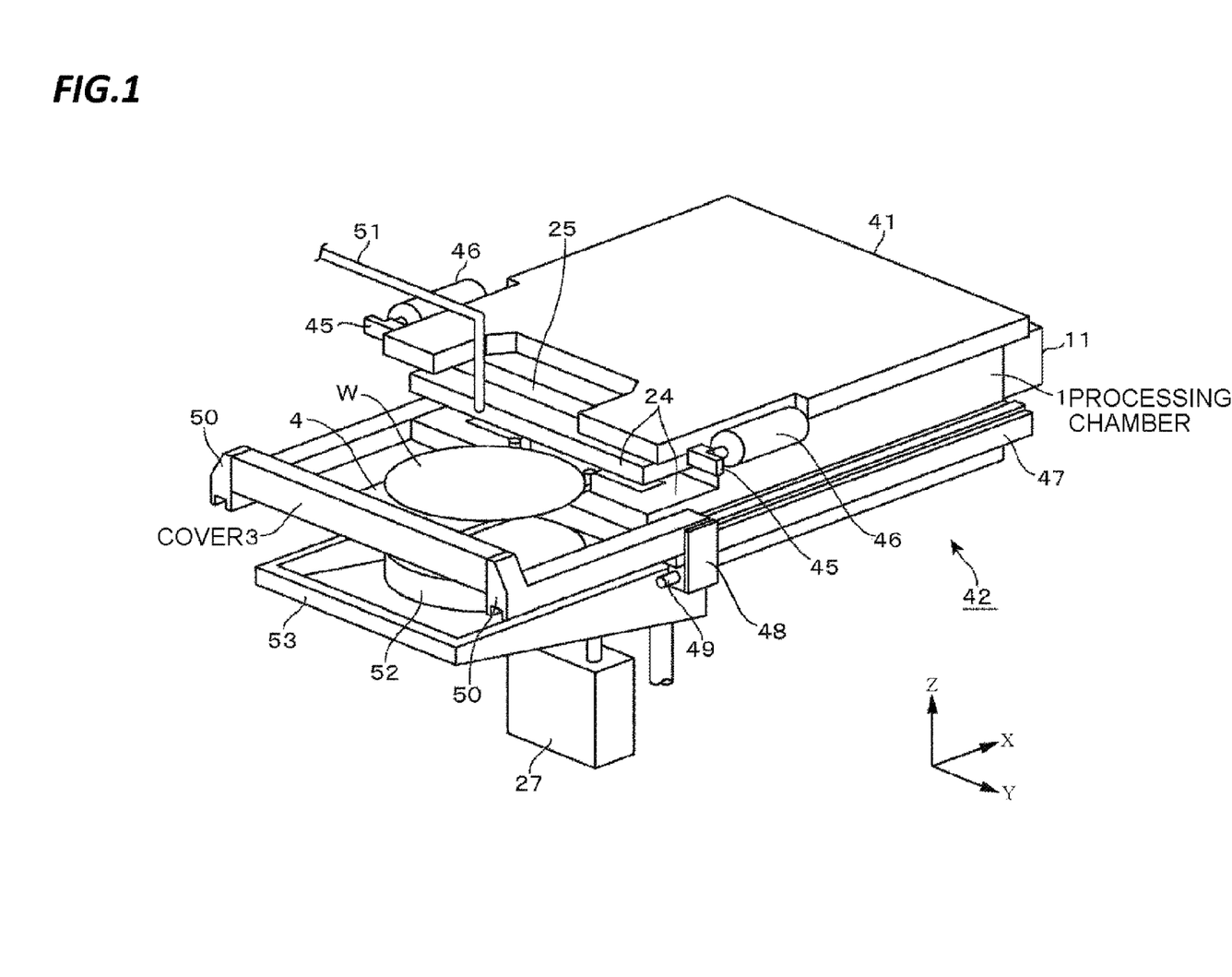
FIG. 1 is a perspective view illustrating an entire configuration of a wafer processing apparatus according to an exemplary embodiment of the present disclosure.
Figure 2:
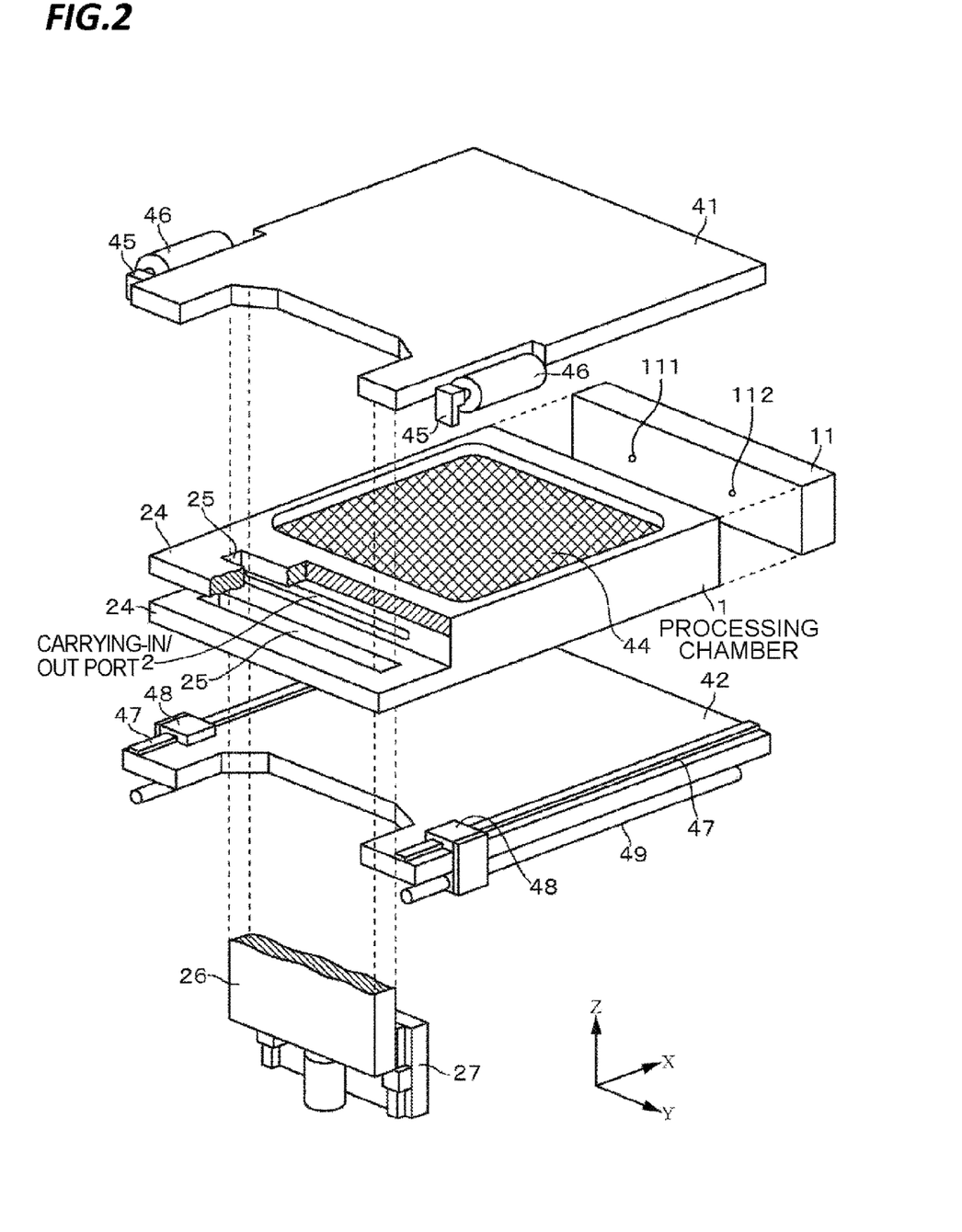
FIG. 2 is an exploded perspective view of the wafer processing apparatus.

Further, as illustrated in FIG. 1, an IPA nozzle 51 installed above the wafer holder 4 at the transfer position supplies an anti-drying liquid, for example, IPA to the wafer W on the wafer holder 4. Meanwhile, under the wafer holder 4 at this position, a cooling mechanism 52 provided with a disc-shaped cooling plate that ejects clean cooling air upwardly is installed to cool the wafer holder 4. A drain receiving pan 53 installed outside the cooling mechanism 52 receives IPA flowing down from the surface of the wafer W and discharges it to the outside.

Operations of the above-described wafer processing apparatus will be described. In the preceding liquid process, a wafer W is subjected to a liquid processing and coated with an anti-drying IPA supplied at the end such that the pattern formed on the wafer W is covered by the anti-drying IPA. Then, the wafer W is transported by the external transportation arm (not illustrated). The transported wafer W is transferred to the wafer holder 4 which stands by at the transfer position, coated again with the IPA by the IPA nozzle 51, and then, accommodated in the processing container 1 which is pre-heated (FIG. 3).

The lock members 45 or the arm members 50 are moved to fix the cover and then, the opening/closing valve V1 of the supply line 231 is opened to supply the supercritical fluid to the processing space 20, thereby processing the wafer W. When the supercritical fluid is supplied to the processing space 20, the IPA coated on the wafer W is blended with the supercritical fluid, and the liquid IPA on the surface of the wafer W is replaced by the supercritical fluid. Since an interface is not formed between the liquid IPA and the supercritical fluid at an equilibrium state, the fluid on the surface of the wafer W may be replaced by the supercritical fluid without causing the collapse of the pattern.

Then, the opening/closing valve V1 of the supply line 231 is closed. When the liquid IPA on the surface of the wafer W is replaced by the supercritical fluid after a pre-set length of time, the opening/closing valve V2 is opened while maintaining the inside of the processing space 20 at a temperature higher than the dew point of the IPA or the raw material of the supercritical fluid so as to discharge the supercritical fluid via the discharge line 291 towards the recovery unit 29. When the discharge of the supercritical fluid is finished, the lock of the cover 3 is released, and the wafer holder 4 is moved to take out the wafer W from which the liquid is removed to be dried.

As described above, in the processing container 1 in which a processing is performed using the supercritical fluid that is a high-pressure fluid, the area of the carrying-in/out port 2 of the wafer W is formed as small as possible to reduce the force applied to a mechanism that locks the cover 3 (the driving units 49 of the sliders 48 or the lock plate 26), thereby promoting miniaturization of the apparatus. For example, in a case where a wafer W having a diameter of 300 mm is held horizontally in the processing space 20, when the ceiling of the processing container 1 is opened or closed to carry in or out the wafer vertically, dozens of tons of force are applied to the ceiling during the processing with supercritical fluid.

Meanwhile, as illustrated in FIGS. 2 and 3, in a case where the wafer W is carried in or out by moving the wafer in the transverse direction, it is possible to considerably reduce the opening area of the carrying-in/out port 2 so that the force applied to the cover 3 may be reduced to several hundred kilograms.

As described above, in the processing container 1 in the present exemplary embodiment, the height of the carrying-in/out port 2 is set to a range of 5 mm to 15 mm, for example, 10 mm or less. Accordingly, the force applied to the lock mechanism of the cover 3 may be reduced to promote the miniaturization of the apparatus.

However, when the opening area of the carrying-in/out port 2 is reduced in this manner, it is difficult to perform a machining of forming the processing space 20 in the processing container 1. As described in the "background" section, it is desirable that the number of joints in the processing container 1 having a high pressure therein is as small as possible. Therefore, the present inventors have studied a method for forming the processing space 20 by cutting the inside of the rectangular parallelepiped block of a stainless steel.

Here, the processing space 20 formed in the block should have a depth capable of accommodating the wafer W having a diameter of 300 mm while the height of the opening serving as the carrying-in/out port 2 is very narrow to the extent of 10 mm. However, in a case of cutting such as end milling, it is difficult to perform a machining of removing a deep portion of a member through such a narrow opening.

Accordingly, the present inventors have adopted a method for constituting the processing container 1 by machining a member in which a cavity corresponding to the processing space 20 is formed by using a wire cut electric discharge machining (hereinafter, referred to as wire cut) or a die-sinking electric discharge machining.

The wire cut is a method of machining a workpiece (the block in the present exemplary embodiment) by imparting potential difference between a thin metal wire and the workpiece to generate electric discharge between the metal wire and the workpiece while supplying a processing liquid. In addition, the die-sinking electric discharge machining is a method of machining using an electrode having a shape corresponding to the shape of a cavity to be carved so as to generate electric discharge between the electrode and a workpiece. These machining methods use a machining table controlled by numerical control (NC), making it possible to accurately cut a narrow area.

Accordingly, the present inventors fabricated processing containers 1 using the wire cut or die-sinking electric discharge machining, and processed wafers W using the supercritical fluid of carbon dioxide (supercritical $CO_2$). However, as described in the following examples, it was found out that a large amount of particles or metal atoms were attached to the surfaces of the wafers W, thereby contaminating the wafers W. In general, it is considered that, when a relatively soft electrode material such as copper, brass (an alloy of copper and zinc) or graphite is used for a metal wire used in the wire-cut or an electrode used in the die-sinking electric discharge machining, the electrode materials scattered from the surfaces of the electrodes during the electric discharge were adhered to and altered the surfaces to be machined.

Since the contaminants are welded to the contaminated machined surfaces by electric discharge to form a contamination layer, it is difficult to remove the contamination layer by washing with pure water such as deionized water (DIW) or acid such as diluted hydrofluoric acid. Further, since the contamination layer has a submillimeter thickness, the contamination layer is hardly removed by an electrolytic polishing which flattens unevenness of a micrometer level. Furthermore, in a case where the contamination layer is not a kind that forms an oxide film by electrolytic polishing, the electrolytic polishing is less effective in suppressing the elution of the contaminants to the supercritical fluid.

Therefore, the present inventors employed a method of plating machined surfaces machined by the wire cut or the die-sinking electric discharge with a noble metal. When a contamination layer may be covered with a noble metal having a high corrosion resistance to the supercritical fluid, contaminants may be suppressed from being eluted when processing a wafer W.

Hereinafter, a method of manufacturing the processing container 1 using this method will be described with reference to FIGS. 4 to 11. Further, for the convenience of illustration, the protrusions 24, 24 which have already been described are omitted in FIGS. 4 to 8, 10 and 11. The protrusions 24, 24 and the openings 25, 25 formed therein may be formed before the processing as described below, or after the machining by, for example, wire-cut or the plating with a noble metal.

Figure 4:
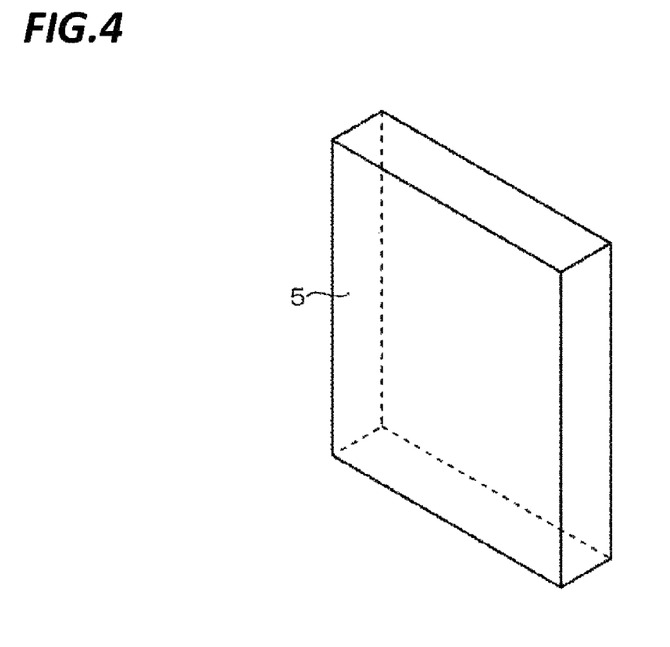
FIG. 4 is a first explanatory view illustrating a process of manufacturing a processing container provided in the wafer processing apparatus.
Figure 5:
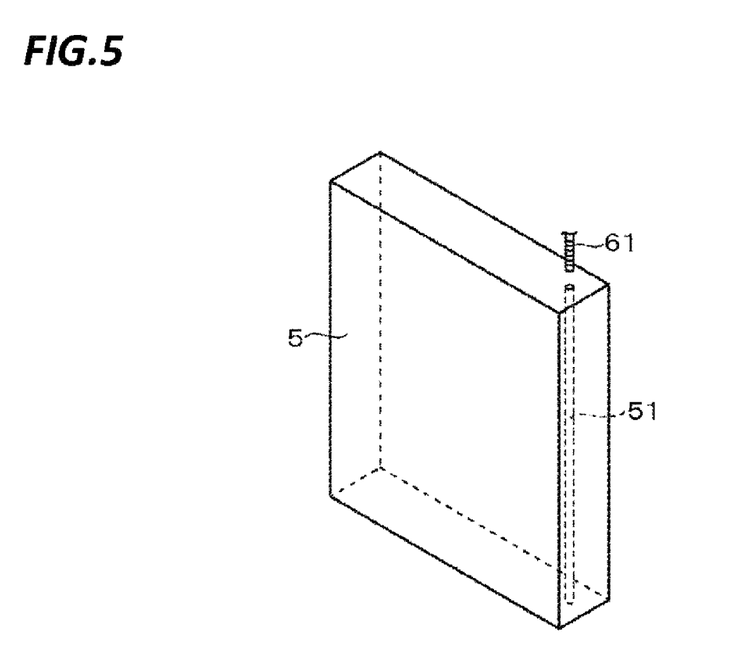
FIG. 5 is a second explanatory view illustrating a process of manufacturing the processing container.

First, descriptions will be made on a method of forming a cavity that serves as a processing space 20 by wire cut. As illustrated in FIG. 4, a flat rectangular parallelepiped block 5 of a stainless steel having the widest faces (the faces that form the ceiling and bottom of the processing container 1) and the faces narrower than the widest faces (the faces that form the flanks of the processing container 1) is prepared. In a case of a rectangular parallelepiped whose widest faces each have a short side and a long side that is longer than the short side, a drilled portion 51 penetrating between the opposite franks bordering the short sides of the widest faces is formed adjacent to one end of each of the flanks by a drill 61 (FIG. 5). By forming the drilled portion 51 opened in the flanks bordering the short sides in this manner, the carrying-in/out 2 with a small opening area may be formed so as to reduce the pressure applied to the cover 3.

Figure 6:
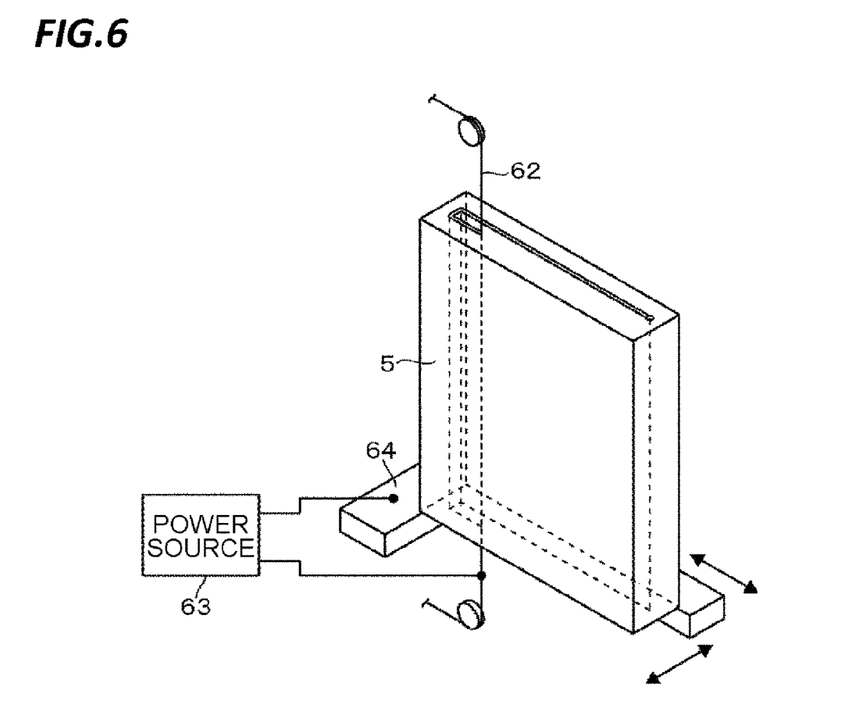
FIG. 6 is a third explanatory view illustrating a process of manufacturing the processing container.

Then, the block 5 is fixed on a table 64 of the wire cut apparatus, and a wire 62 is installed through the punching portion 51. Electric power is supplied from the power supply unit 63 while supplying a processing liquid (not illustrated) between the block 5 and the wire 62. In the example as illustrated in FIG. 6, the power supply unit 63 is connected to the table 64, and electric power is supplied via the table 64 to the block 5. The electric power applied to the wire 62 and block 5 may be alternating current or direct current as long as electric discharge is generated between the wire 62 and the block 5.

Further, the table 64 that holds the block 5 is formed in an L-shape to support the bottom of the block 5 with each side of the L-shape. Since the wire 62 penetrating the block 5 is drawn to a notch region of the table 64, the block 5 may be machined without being interfered with the table 64.

Figure 7:
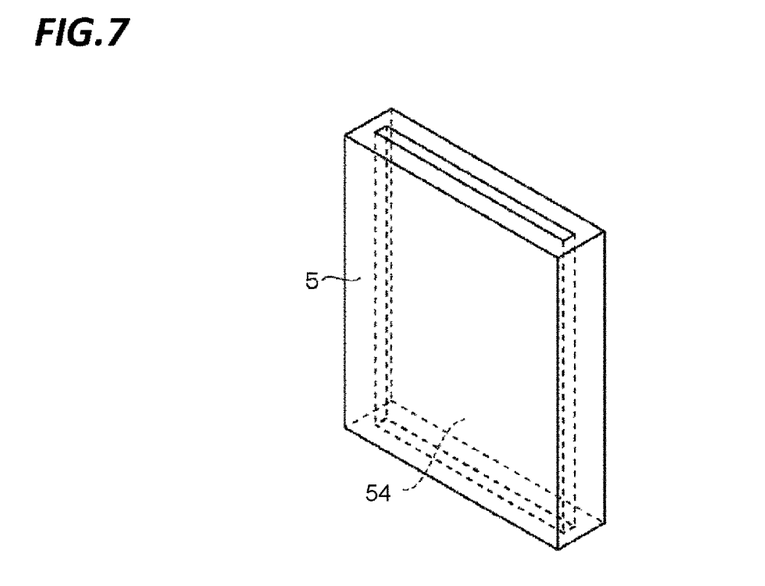
FIG. 7 is a fourth explanatory view illustrating a process of manufacturing the processing container.

Further, the table 64 is configured to be movable transversely along the long side and the short side of the block 5 by NC, and moves the block 5 while generating electric discharge between the wire 62 and the block 5 to cut the block 5. In addition, the block 5 is moved along the shape of the processing space 20 and the inside of the block 5 is cut, thereby forming a through hole 54 that is a flat cavity extending from one flank to the other flank of the opposite franks (FIG. 7).

As described above, a contamination layer 53 that contaminates a wafer W during a processing with a supercritical fluid is formed on each machined surface of the through hole 54 formed by the wire cut. Therefore, a noble metal is plated so as to cover the contamination layer 55.

Figure 9:
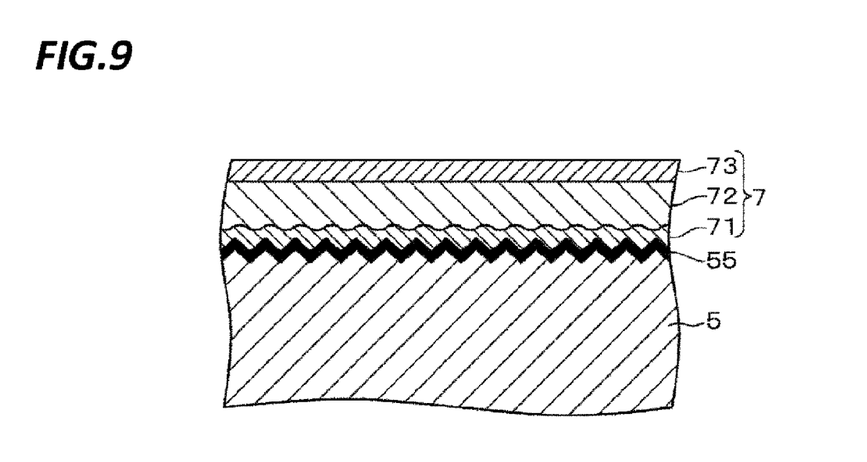
FIG. 9 is a cross-sectional view illustrating a state of the internal surface of the processing container.

The method of plating the machined surfaces of the through hole 54 is not particularly limited, but may be an electroplating method or an electroless plating method. FIG. 9 illustrates an example in which a gold plating layer 73 is formed through an electroless nickel plating layer 72 in order to enhance adhesion to the block 5. In this example, a strike layer 71 which forms a species growing electroless plating is formed under the electroless nickel plating layer 72.

Figure 8:
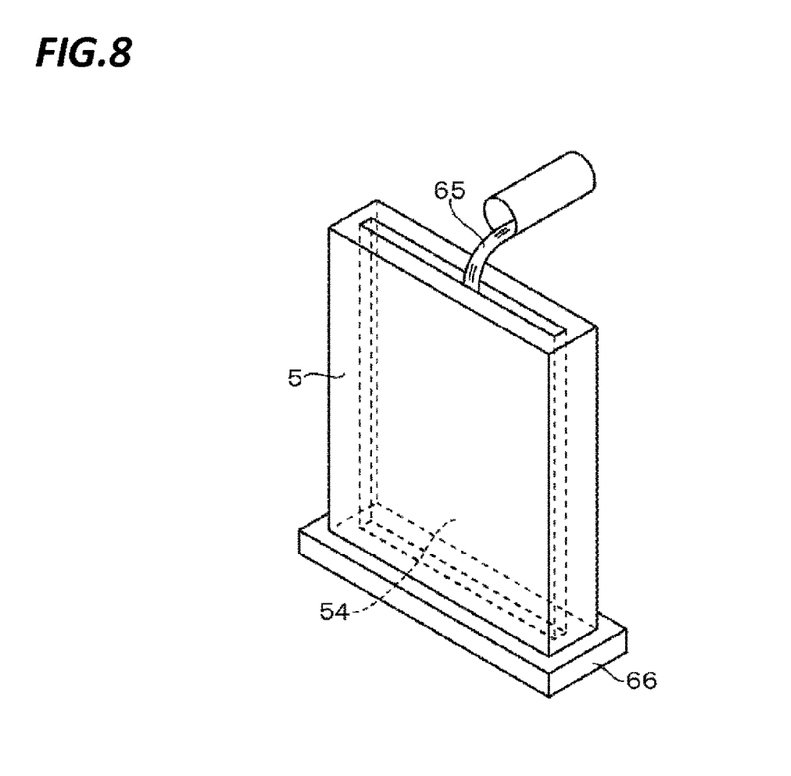
FIG. 8 is a fifth explanatory view illustrating a process of manufacturing the processing container.

When forming the plating layer 7, as illustrated in FIG. 8, the other side of the through hole 54 is sealed with a bottom plate member 66, and a plating liquid 65 is supplied to the container-shaped block 5, thereby bringing the plating liquid 65 into contact with the surfaces machined by the wire cut. Then, the plating layer 7 is deposited by supplying electric power between the plating liquid 65 and the block 5, or by electroless plating. In that event, when the plating layer 7 is also formed on the rear cover 11, the rear cover 11 that is formed prior to forming the discharge hole 111 or the supply hole 112 or that clogs the through hole 54 may be used as the bottom plate member 66.

By this processing, since the top surface of the contamination layer 55 is covered by the plating layer 7 as illustrated in FIG. 9, the contaminants may be suppressed from being eluted when processing the wafer W with the supercritical fluid. It shall be noted that the thicknesses of the plating layer 7 (including the strike layer 71, the electroless nickel plating layer 72 and the gold plating layer 73) and the contamination layer 55 illustrated in FIG. 9 are not illustrated as actual thicknesses of these layers.

A high-pressure container is constructed by using the block 5 prepared by the above-described method as a processing container 1 (container body) and combining the rear cover 11 configured to clog the through hole 54, and the cover 3.

Here, the rear cover 11 that air-tightly seal one end of the through hole 54 of the processing container 1 corresponds to a metal member an exemplary embodiment of the present disclosure.

Figure 10:
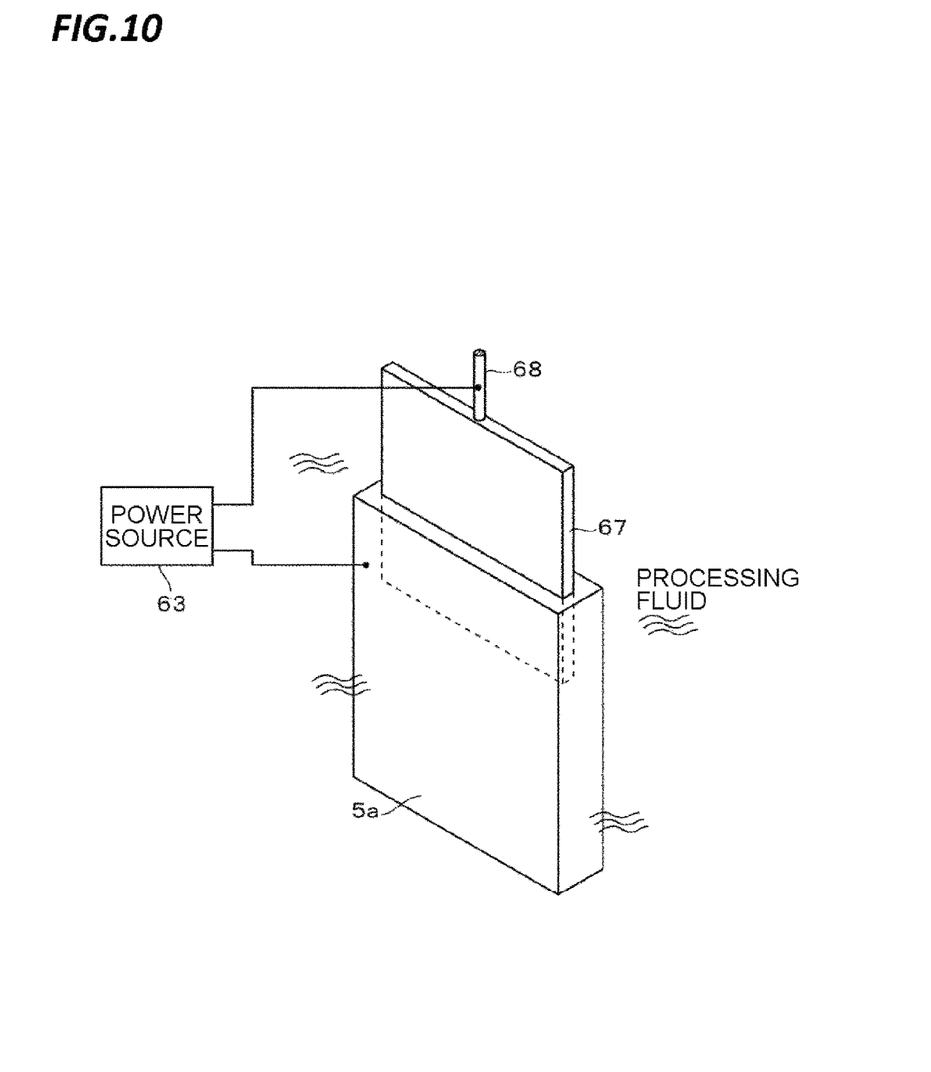
FIG. 10 is a first explanatory view illustrating a process of manufacturing a processing container according to another exemplary embodiment.

Next, descriptions will be made on an example of processing a flat cavity 52a that serves as the processing space 20 by a die-sinking electric discharge machining with reference to FIGS. 10 and 11. FIG. 10 is a schematic view illustrating a state where the cavity 52a is formed in a block 5a by a die-sinking electric discharge machining. In the die-sinking electric discharge machining as illustrated in FIG. 10, an electrode 67 made of black lead (graphite) or copper which is formed in a shape corresponding to the shape of the cavity 52a, and the block 5a are connected to the power supply unit 63 configured to supply pulse power, and immersed in a processing liquid such as oil. Then, pulse power is applied to the electrode 67 and the block 5a while sequentially bringing the electrode 67 into close proximity to the block 5a to carve the cavity 52a in a shape corresponding to the electrode 67.

Unlike the wire cut, in the die-sinking electric discharge machining, the cavity 52a may be formed without penetrating two mutually opposite surfaces, by finishing the machining before the electrode 67 reaches the other surface. In the example as illustrated in FIG. 10, the electrode 67 is supported by a rod-shaped support member 68, and the cavity 52a may be carved to a desired depth by moving up and down the support member 68 installed on an elevation mechanism (not illustrated) by NC.

Figure 11:
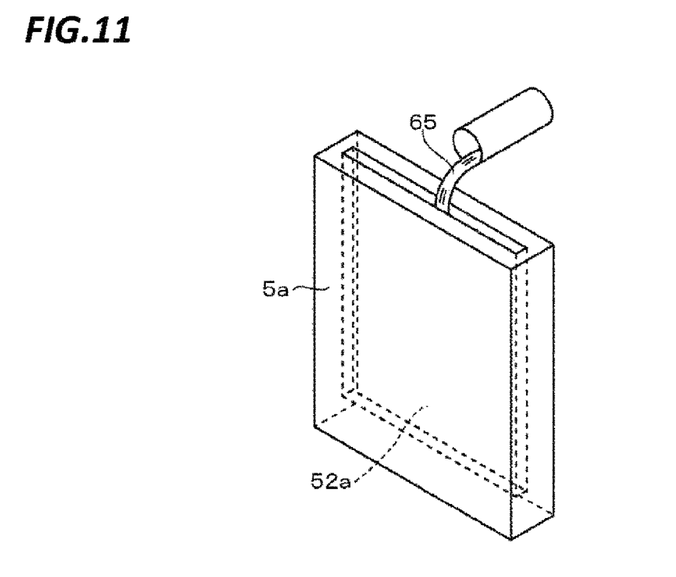
FIG. 11 is a second explanatory view illustrating a process of manufacturing the processing container according to another exemplary embodiment.

As described above, in a case where the cavity 52a does not penetrate the block 5a, the plating layer 7 may be formed by supplying the plating liquid 65 to the inside of the container-shaped block 5a, without using the bottom plate member 66 (FIG. 11).

A high-pressure container is constructed by using the block 5a prepared by the above-described method as a processing container 1 (container body) and combining the cover 3.

The metal used for the plating layer 73 which is in contact with the supercritical fluid is selected from noble metals having corrosion resistance to the fluid, such as gold (Au), silver (Ag), platinum (Pt), palladium (Pd), rhodium (Rh), iridium (Ir), ruthenium (Ru), and osmium (Os). Adhesion layer such as the electroless nickel plating layer 72 and gold plating layer 73 may be formed as desired.

With the high-pressure container of the wafer processing apparatus according to the present disclosure, the following effects may be obtained. Since a noble metal plating layer 7 is formed on the internal wall surface (machining surface) of the through hole 54 or the cavity 52a in the processing container 1 that serves as the high-pressure container, elution of contaminants be suppressed in a convenient manner while a processing of a wafer W is performed with a supercritical fluid by using the through hole 54 or the cavity 52a as the processing space 20, and the processing of the wafer W may be started in the clean processing space 20.

Here, in the cover 3 or the rear cover 11 that is formed integrally with the processing container 1 to form the processing space 20, a plating layer 7 may be or may not be formed on the surface that is in contact with the supercritical fluid. Since the cover 3 or the recover 11 does not have a narrow space which cannot be formed unless the wire cut or the die-sinking electric discharge machining is used, a flat surface may be machined by a conventional cutting. Therefore, the elution of contaminants to the supercritical fluid may be reduced sufficiently by washing with pure water or acid, or forming an oxide film by electropolishing. Accordingly, in this case, even if the plating layer 7 is not formed on the cover 3 or the rear cover 11, a good processing result may be obtained.

Figure 12:
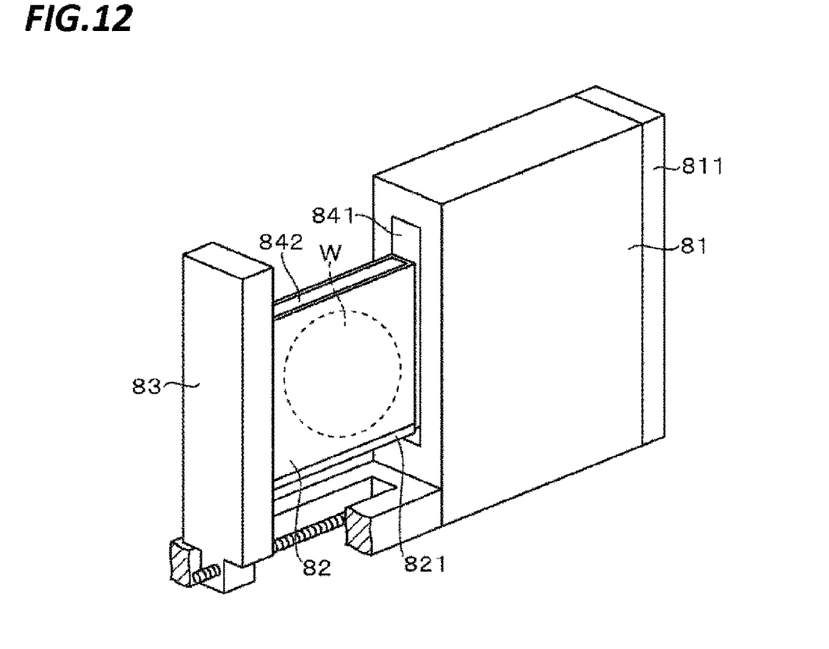
FIG. 12 is a perspective view illustrating an appearance of the processing container according to another exemplary embodiment.

FIG. 12 illustrates another type of a wafer processing apparatus, in which a flat container-shaped internal container 82 is filled with a liquid raw material of a supercritical fluid, and a wafer W is held vertically such that the wafer W is immersed in the liquid raw material. Here, the number of the wafers W held in the internal container 82 is not limited to one. Two or more wafers may be held in the internal container 82.

The internal container 82 is held on the cover 83. When the internal container 82 is moved towards an external container 81 to clog the carrying-in/out port of the external container 81 with the cover 83, a processing space is formed in the inside of the external container 81 and the internal container 82. And, when the liquid raw material is converted from the liquid state to the supercritical state by heating, and then the pressure is reduced, a wafer W in a dried state is obtained.

In this example, the internal container 82 has a function as a substrate holding unit as well as a function as a processing container. In addition, in preparing the external container 81 or the internal container 82, the method described with reference to FIGS. 4 to 8 may also be employed to machine a block by the wire cut or the die-sinking electric discharge machining to form a through hole 54 or a cavity 52a and then, form a plating layer 7 on the machining surface. In the case of the machining performed by the wire cut, one end of the through hole 54 may be clogged with a rear cover 811; 821 which is a metal member.

Further, when the widest faces of the flat rectangular parallelepiped block 5 are rectangular, the present disclosure is not limited to the case where the carrying-in/out port 2 is formed at a flank bordering the short sides as illustrated in FIG. 2. In a case where the cover 83 is locked by a sufficiently strong force, a carrying-in/out port 841 may be formed at the frank bordering the long sides as illustrated in FIG. 12.

Heretofore, descriptions has been made to a method of forming a plating layer 7 on machined surfaces of the through hole 54 or the cavity 52a formed by wire cut or die-sinking electric discharge machining. However, when the narrow through hole 54 may be formed by a cutting method or a wire saw, it is not excluded that elution of contaminants is suppressed by forming the plating layer 7 on the machined surfaces. The plating layer may be effective in suppressing contamination of a wafer W in a case where a sufficiently flat machining surface may be formed due to the formation of a narrow cavity.

As for the high-pressure fluid, a supercritical fluid of IPA, hydrofluoroether (HFE), fluorocarbon (FC) or a mixture thereof, or a subcritical fluid of these materials (a fluid which is at a temperature or pressure lower than the supercritical temperature or pressure and may dissolve a solid without causing collapse of a pattern) may be used, besides $CO_2$.

Further, in addition to the above-described dry processing, the present disclosure may be widely applied to wafer processings using a high-pressure fluid (supercritical fluid or subcritical fluid) such as a processing of removing (dissolving) a resist film from the surfaces of wafers W.

EXAMPLE

Test 1

Metal pieces cut by wire cut were placed in an extract liquid, and the elution of metal to the extract liquid in the case where a plating layer 7 was formed was compared with that in the case where no plating layer 7 was formed.

A. Test Conditions

Example 1

A stainless steel (SUS316) having a thickness of 1 mm was machined to a 7 mm×30 mm board by wire cut using a brass metal wire. Then, the oxide film of the surface of the board was removed by a chemical liquid, and a gold plating layer of 0.2 μm was formed on the top of a Ni adhesion layer of 7 μm. The metal piece was immersed in a supercritical fluid in a clean SUS container for 6 hours, and the metal components eluted to the IPA liquid were measured by an inductively coupled plasma spectrometry (ICP-MS).

Comparative Example 1

The same test as in Example 1 was performed on a metal piece on which no noble metal plating is performed.

B. Test Results

The test results of Example 1 and Comparative Example 1 are represented in Table 1.

TABLE 1

| | Elution to extract liquid (wt. ppb) | | | | |
| --- | --- | --- | --- | --- | --- |
| | Chromium | Iron | Nickel | Copper | Gold |
| Example 1 | 0.1> | 0.2 | 0.1> | 0.1> | 0.1> |
| Comparative Example 1 | 6.0 | 54 | 7.0 | 44 | — |

According to the results represented in Table 1, in Example 1 in which gold plating was performed, elution of metals to the extract liquid was not practically confirmed, and the elution of chromium, nickel, copper and gold was less than the detection limit. Further, the amount of eluted iron is the same as the amount eluted from the SUS container.

Whereas, in Comparative Example 1 in which gold plating was not performed, elution of copper of the metal wire was confirmed, in addition to the elution of chromium, iron and nickel of the stainless steel. From the test results, it may be appreciated that gold plating is effective in suppressing elution of a metal to the extract liquid.

Test 2

A high-pressure container was fabricated by using a processing container 1 in which a through hole 54 formed by wire cut is used as a processing space 20, and a wafer was processed in the wafer processing apparatus as illustrated in FIGS. 1 to 3. The temporal changes in contamination of wafers W in a case where machined surfaces were plated with gold and in the case where machined surfaces were not plated were investigated.

A. Test Results

Example 2-1

A dry silicon wafer W having a diameter of 300 mm were placed in a high-pressure container in which the processing space 20 having a height of 10 mm and a volume of 1,000 cm$^3$ was formed by wire cut, and a plating layer 7 as illustrated in FIG. 9 was formed on the machined surfaces of the processing container 1. Then, supercritical $CO_2$ whose temperature and pressure were made higher than the supercritical temperature and pressure was supplied to the processing space 20 and maintained for 10 minutes. Then, the number of particles attached to the surface of the wafer W taken out from the high-pressure container was determined by a particle counter (Surfscan SP1 manufactured by KLA-Tencor Corp.). Further, the number of iron and copper atoms attached to the surfaces of the wafer W was determined by a total reflection X-ray fluorescence spectrometry. Then, the processing was performed successively on a plurality of wafers W, and the temporal changes of the number of particles and the number of metal atoms were investigated.

Example 2-2

A test which is the same as that in Example 2-1 was performed, except that wafers W coated with 15 cc of IPA were placed in the processing container 1.

Comparative Example 2-1

A test was performed under the same conditions as in Example 2-1, except for using the processing container 1 in which the plating layer 7 was not formed on the surfaces machined by wire cut.

Comparative Example 2-2

A text was performed under the same conditions as in Example 2-2, except for using the processing container 1 in which no plating layer 7 was formed on the surfaces machined by wire cut.

B. Test Results

Figure 13:
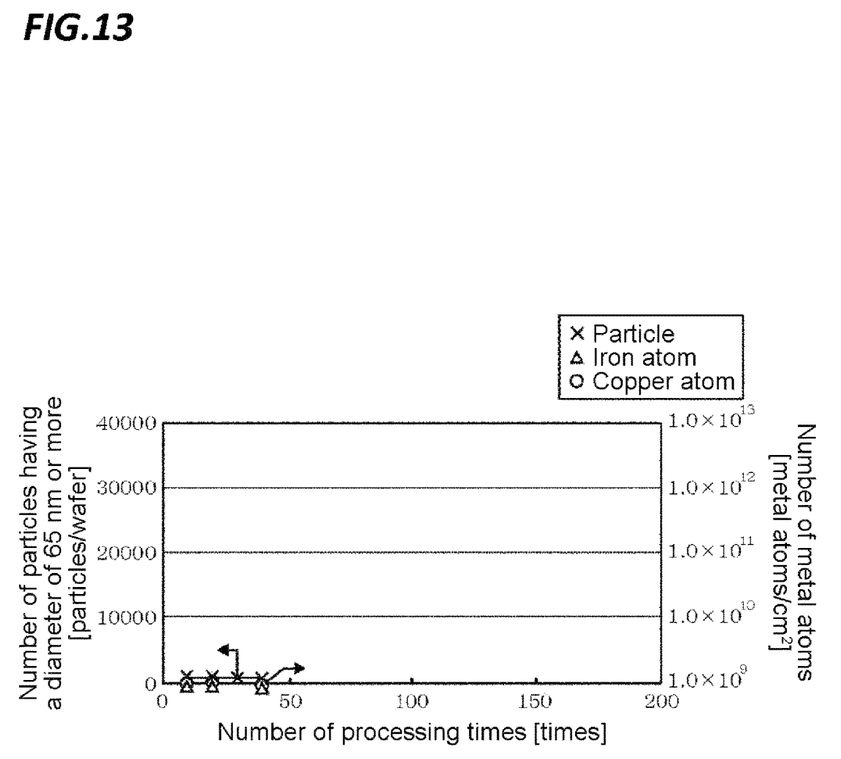
FIG. 13 is a graph representing test results of Examples.
Figure 14:
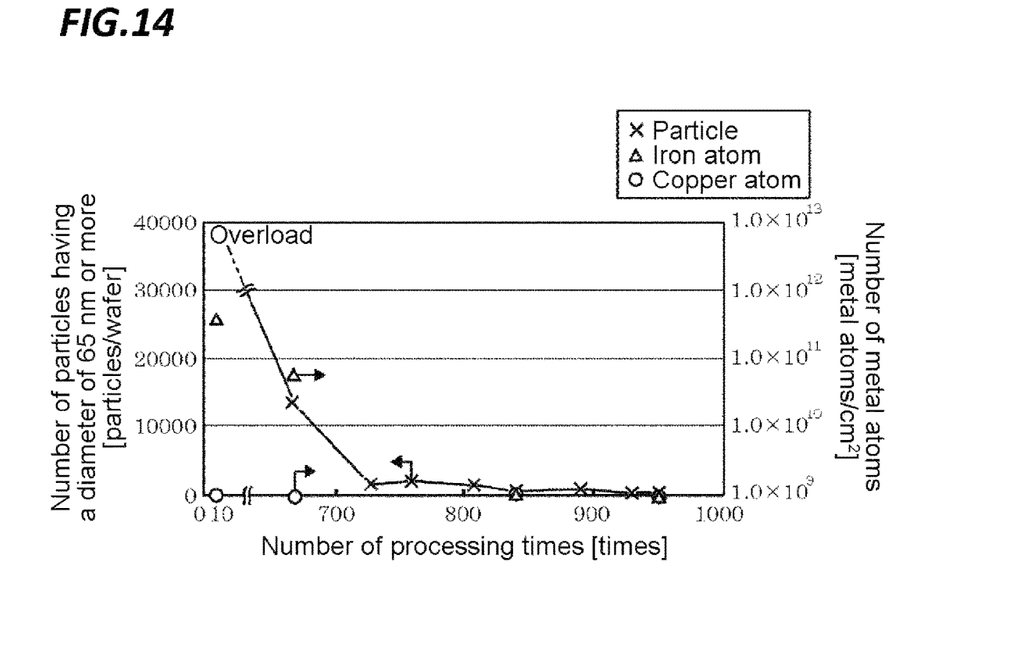
FIG. 14 is a graph representing test results of Comparative Examples.
Figure 15:
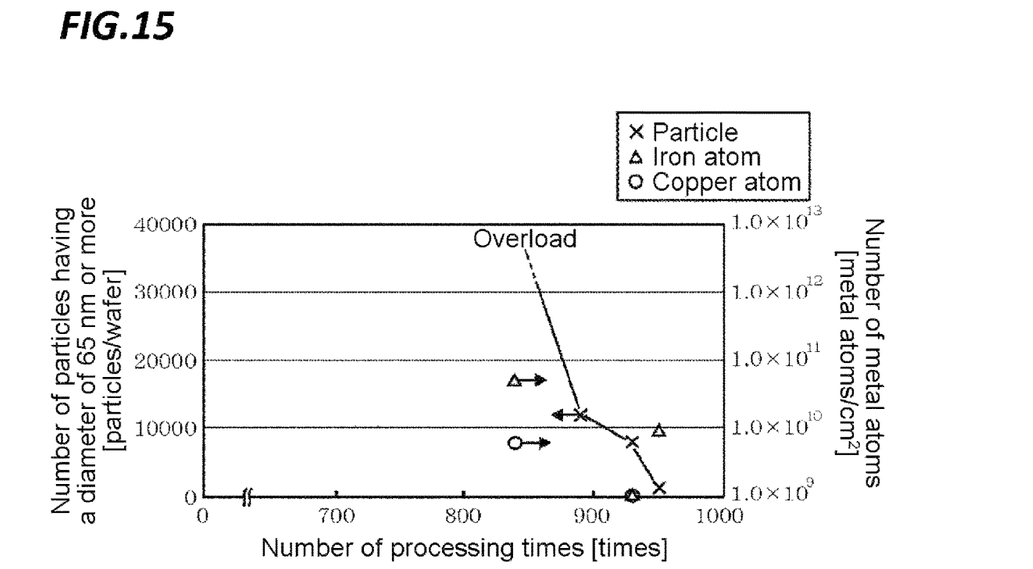
FIG. 15 is another graph representing testing results of Comparative Examples.

The test results of Example 2-1 and Comparative Examples 2-1 and 2-2 are represented in FIGS. 13 to 15. In the figures, the horizontal axis represents the number of processed wafers W, the left vertical axis represents the number of particles having a diameter of 65 nm or more, and the right vertical axis represents the number of metal atoms such as iron and copper. And, the number of particles is plotted by mark x, the number of iron atoms is plotted by mark Δ, and the number of copper atoms is plotted by mark ○.

According to the result of Example 2-1 as illustrated in FIG. 13, from the beginning of the processing, the number of particles having a diameter of 65 nm or more was about 1,000 particles/wafer, and the number of iron or copper atoms were below the lower detection limit of the measuring instrument. Since these are also the same in the case of Example 2-2 in which the processing was performed in the state where IPA was coated, the illustration of Example 2-2 is omitted.

Meanwhile, in Comparative Example 2-1 in which a dry wafer W is processed using the processing container 1 not formed with a plating layer 7, the number of particles at the beginning of the processing was in an overload state exceeding the measurement range of the measuring instrument, as illustrated in FIG. 14. Further, iron atoms were detected in an order of $10^{11}$ or more atoms, but copper atoms were not detected. The number of particles decreased as the number of wafers W processed increased, reached a measurable number when 600 wafers W were processed, and reached the same number as in Example 1-1 when 720 wafers were processed. In addition, the number of iron atoms decreased as the number of processed wafers increased, and became below the lower detection limit when 850 wafers have been processed.

Further, in Comparative Example 2-2 in which IPA, as a solvent, was coated on wafers W, and a test was performed under the conditions similar to the actual processing, the wafers W were contaminated more seriously than those of Comparative Example 2-1, and the number of particles was in an overload state even when 850 wafers W were processed, as illustrated in FIG. 15. And, when 950 wafers W were processed, the number of particles reached the level similar to those of Examples 2-1 and 2-2. Further, in this example, the elution of copper atoms was confirmed, as well as the elution of iron atoms. Further, the number of copper atoms became below the lower detection limit when 930 wafers W were processed, but the confirmed number of iron atoms was about $10^{10}$ atoms even when 950 wafers W were processed.

Comparing the results of Examples 2-1 and 2-2 and Comparative Examples 2-1 and 2-2, it may be appreciated that the contamination of wafers W may be remarkably reduced when a plating layer 7 is formed on surfaces of machined by wire cut.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A high-pressure container comprising:
    a container body including a flat rectangular parallelepiped block of a metal which is formed with a flat cavity that serves as a substrate processing space in which a processing using a high-pressure fluid is performed on a substrate, the flat cavity being formed by machining the flat rectangular parallelepiped block from one of faces of the flat rectangular parallelepiped block other than a widest face towards another face opposing thereto; and a cover configured to open/close the substrate processing space, wherein at least one of inner wall surfaces of the flat cavity is coated with a plating layer of a noble metal, and an electroless nickel plating layer is interposed between the inner wall surfaces of the flat cavity and the plating layer of the noble metal, and a thickness of the plating layer of the noble metal is about 0.2 μm.

2. The high-pressure container of claim 1, wherein the container body is formed with a through hole on at least one of the faces of the block by the machining, and one end of the through hole is air-tightly sealed by a metal member.

3. The high-pressure container of claim 2, wherein the machining is a wire cut electric discharge machining.

4. The high-pressure container of claim 1, wherein the machining is performed by a die-sinking electric discharge machining in which an electrode formed in a shape corresponding to a shape of the cavity is sequentially brought into close proximity to the block so as to form a cavity which is not penetrated.

5. The high-pressure container of claim 1, wherein the widest face has a short side and a long side that is longer than the short side, and the face on which the cavity is opened is a face at the short side.

6. The high-pressure container of claim 1, further comprising a substrate holding unit configured to restrain a position of the substrate such that the substrate is opposite to the widest face.

7. The high-pressure container of claim 1, wherein a distance between the inner wall surfaces of the cavity is in a range of 5 mm to 15 mm.

8. A high-pressure container comprising:

a container body including a block of metal in which a flat cavity is opened on at least one of faces serving as a processing space for a substrate, wherein a plating layer of a noble metal is formed on an inner wall surface of the block, and a cover is provided to open or close the processing space, thereby allowing a processing on the substrate using a high-pressure fluid, an electroless nickel plating layer is interposed between the inner wall surface of the block and the plating layer of the noble metal, and a thickness of the plating layer of the noble metal is about 0.2 μm.

9. The high-pressure container of claim 8, wherein the block has a flat rectangular parallelepiped shape, and the at least one of faces is a face other than a widest face of all faces of the block.

10. The high-pressure container of claim 9, wherein the widest face has a short side and a long side that is longer than the short side and the face on which the cavity is opened is a face at the short side.

11. The high-pressure container of claim 9, further comprising a substrate holding unit configured to restrain a position of the substrate such that the substrate is opposite to the widest face.

12. The high-pressure container of claim 9, wherein a distance between inner wall surfaces of the cavity is in a range of 5 mm to 15 mm.

13. The high-pressure container of claim 8, wherein the cavity of the block penetrates from one face to another face opposing thereto, and a metal member is air-tightly bonded to one face among the faces of the block on which a through hole is opened.

14. A substrate processing apparatus, comprising:

the high-pressure container of claim 1;

a fluid supply line connected to the high-pressure container and configured to supply a high-pressure fluid or a row material fluid that becomes the high-pressure fluid when performing at least one of heating and pressurization; and a fluid discharge line configured to discharge the high-pressure fluid in the high-pressure container.

* * * * *